United States Patent [19]
Kash et al.

[11] Patent Number: 6,028,952
[45] Date of Patent: Feb. 22, 2000

[54] SYSTEM AND METHOD FOR COMPRESSING AND ANALYZING TIME-RESOLVED OPTICAL DATA OBTAINED FROM OPERATING INTEGRATED CIRCUITS

[75] Inventors: Jeffrey Alan Kash, Pleasantville; Daniel R. Knebel, Carmel; Pia Naoko Sanda, Chappaqqua; James Chen-Hsiang Tsang, White Plains, all of N.Y.

[73] Assignee: International Business Machines Corporation, Armonk, N.Y.

[21] Appl. No.: 09/026,063

[22] Filed: Feb. 19, 1998

[51] Int. Cl.$^7$ ....................................................... G06K 9/00
[52] U.S. Cl. ........................................... 382/141; 382/232
[58] Field of Search .................................. 382/141, 151, 382/209, 205, 232; 324/751, 752, 753, 501; 348/79; 356/218; 250/214 VT

[56] References Cited

U.S. PATENT DOCUMENTS

| | | | |
|---|---|---|---|
| 4,704,522 | 11/1987 | Hirai et al. | 250/214 VT |
| 4,811,090 | 3/1989 | Khurana | 348/79 |
| 5,694,211 | 12/1997 | Ohska et al. | 356/218 |

*Primary Examiner*—Joseph Mancuso
*Assistant Examiner*—Vikkram Bali
*Attorney, Agent, or Firm*—Scully, Scott, Murphy & Presser; Kevin M. Jordan, Esq

[57] ABSTRACT

A system and method to reduce, compress, and analyze the raw data obtained in an apparatus which measures the time-resolved emission of light from an operating integrated circuit is described. The system and method reduce the storage requirements for a tool which measures this emission, and can also reduce the computational time for analysis of the data.

18 Claims, 2 Drawing Sheets

SYSTEM AND METHOD FOR COMPRESSING AND ANALYZING TIME-RESOLVED OPTICAL DATA OBTAINED FROM OPERATING INTEGRATED CIRCUITS

FIELD OF THE INVENTION

The invention relates to optical test apparatus for testing integrated circuits, and more particularly, to a system and method for compressing data accumulated from such test apparatus.

BACKGROUND OF THE INVENTION

The raw data collected during a measurement of time-resolved optical emission from an operating integrated circuit consists of individually detected photons, where for each photon coordinates x,y, and t (i.e., two spatial coordinates x,y representing the location of the occurrence in the sample plane plus a time coordinate t representing the time at which the photon was emitted) are required to be stored. This data is collected by repeatedly applying the same test input under constant conditions to a circuit and monitoring the location and time of photon emissions resulting from switching events in the circuit. Repetition is required because in most cases, and particularly in the case of integrated circuits fabricated from silicon, an individual switching event will result in a detected photon with a probability of much less than 1, and typically on the order of $10^{-6}$. A photon emission will be considered to have occurred for a given x,y,t if at least one of the iterations of processing the input signal resulted in the detection of a photon for that x,y,t triple. Typically, x, y and t can each be represented as an integer, where x and y might range from 0 to 1023, representing points on a grid defining the area of interest, while t might range from 0 to 8191, representing gradations of time over some period of observation. In order to store this data in histogram form, the array must contain 8 billion elements, or 16 gigabytes of memory, allocating 2 bytes per array element. Because of this large storage requirement, storage of the data in this form is usually impractical.

An alternative storage approach, called "list" storage, stores the data more efficiently when the number of detected photons is much less than the number of array elements in the histogram. In list storage, the data is stored as a long list of (x,y,t) coordinates, where each (x,y,t) triple represents the coordinates for a single detected photon. Using the numbers given above, and assuming that there are, for example, 20 million detected photons, the list file would only be 120 million bytes long, much smaller than the 16 gigabyte histogram file. List and histogram modes both contain the same information, just stored in different ways.

SUMMARY OF THE INVENTION

This invention teaches additional storage methods which reduce memory storage requirements. Because these methods use less memory and are more structured than list or histogram modes, they can also reduce the computational time for analysis of the data.

The methods fall into two general classes: those which compress the data without any loss of the original data ("lossless compression") and those for which the original data cannot be fully reconstructed ("lossy compression"). In a preferred embodiment of the invention, a combination of these methods will produce optimal results. It should be noted that information describing which of the iterations of the application of a given input resulted in a photon emission for a given x,y,t triple is usually not useful in the testing of integrated circuits. Therefore, a compression method which loses track of this order will be considered lossless. If this were not true, then histogram and list storage modes discussed above would not be equivalent.

DETAILED DESCRIPTION OF A PREFERRED EMBODIMENT OF THE INVENTION

Figure 1:
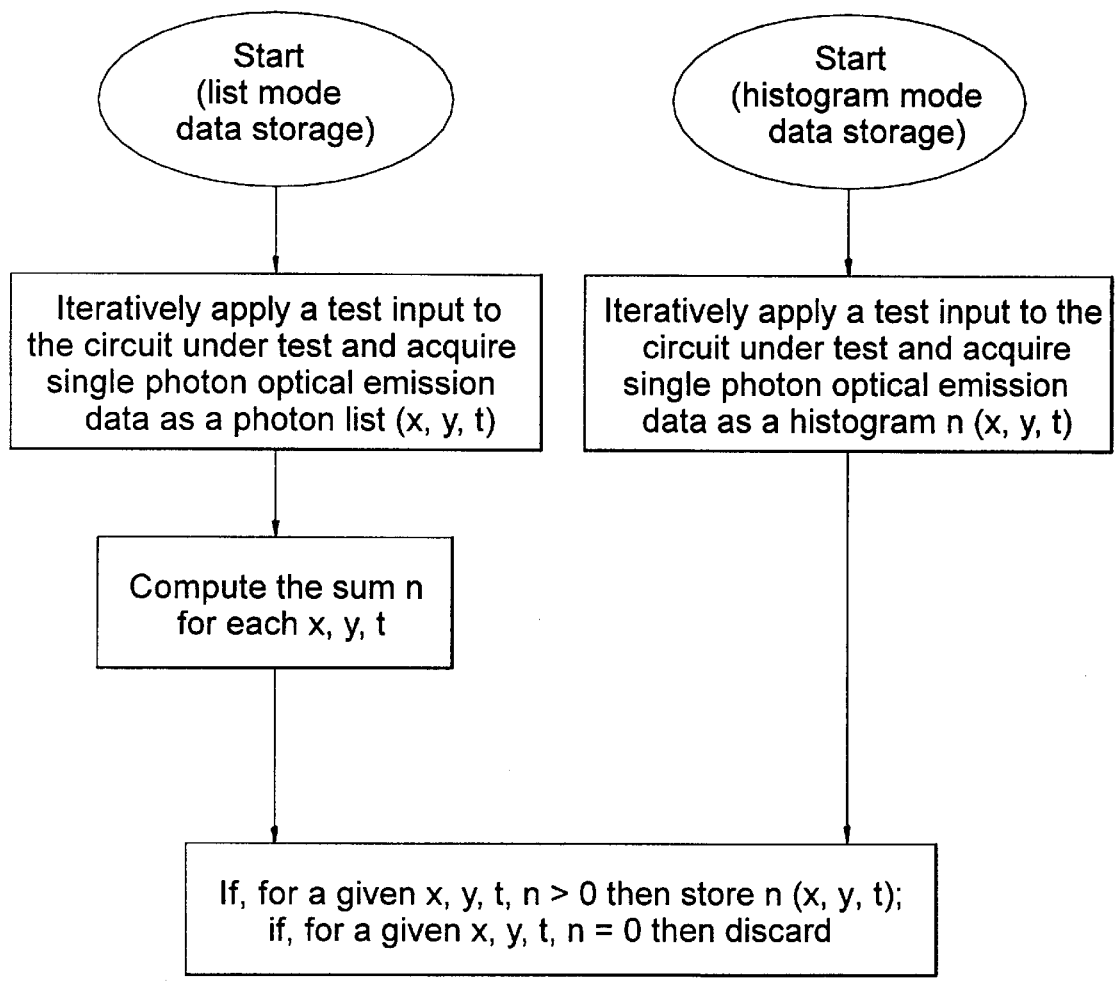
FIG. 1 is a process flow diagram describing a first embodiment of the compression technique according to the invention.
Figure 2:
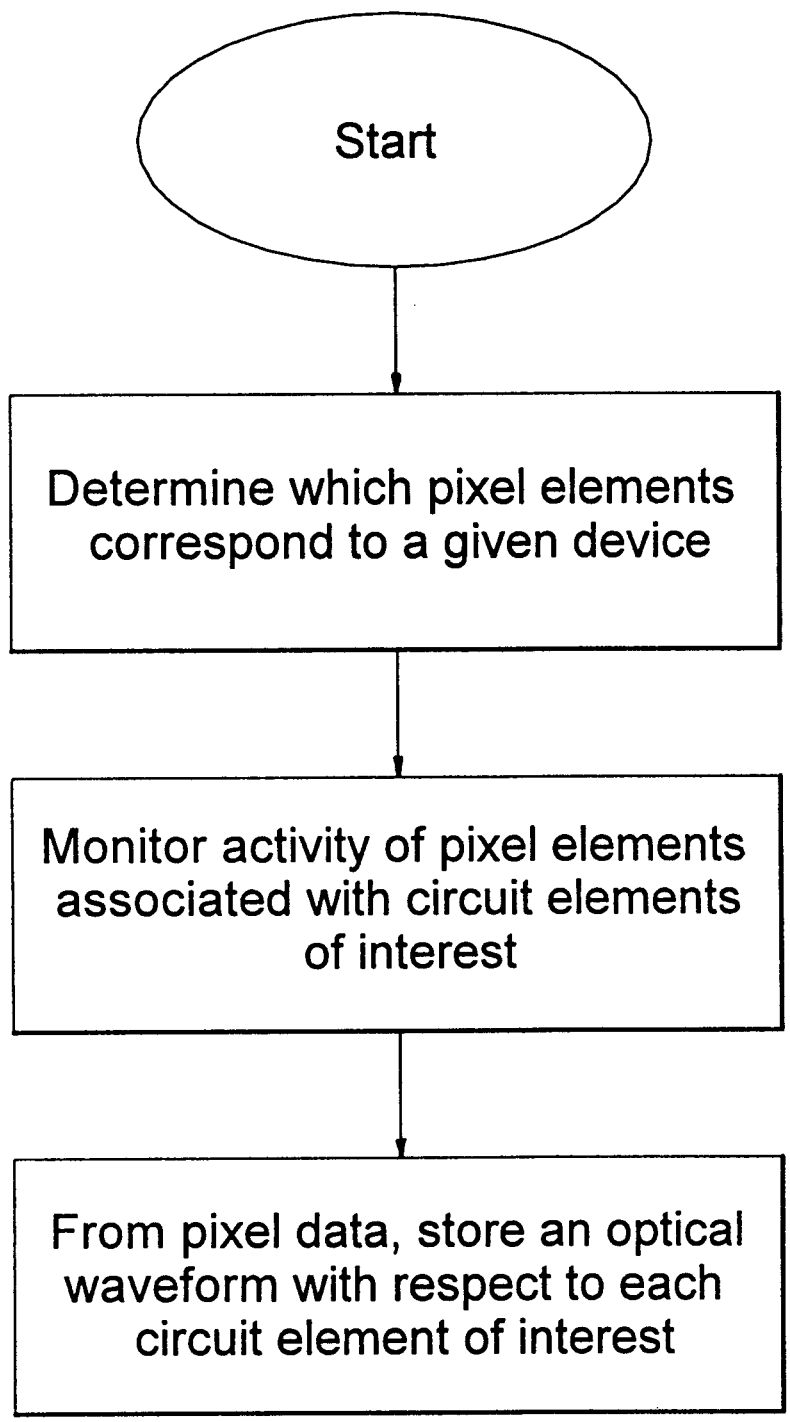
FIG. 2 is a process flow diagram describing a second embodiment of the compression technique according to the invention.

In a first embodiment of the invention, with reference to the flow diagram of FIG. 1, a lossless reduction of the memory required to store the data generated from time-resolved optical emissions can be obtained in a modified histogram mode by accumulating data representing coordinates x,y,t and the number, n, of photons at x,y,t—storing only values of n(x,y,t) which are nonzero. This method of storage can be significantly more efficient than either conventional histogram or list modes. This is particularly true when, as is typical for data on optical emission from operating CMOS circuits, the emission comes out only during limited periods of time and from limited areas of the chip, i.e., many photons will have the same (x,y,t) coordinates, while many other (x,y,t) coordinates will have no photons at all.

One algorithm for compressing data into this form from list mode is to first sort the list data so that all photons from all iterations with the same (x,y,t) coordinates are grouped together, which provides an easy means to count the number n. If n>0, the result is stored as the number n of photons which have this value (x,y,t).

Further lossless compression of data stored in this modified histogram mode can be achieved by any compression scheme which does not lose data, such as any scheme which is used for disk compression on a PC today.

The above storage schemes have the advantage of keeping every piece of information in the raw data, without any loss of information. In accordance with a further embodiment of the invention, data is further compressed by making certain assumptions about the data and using those assumptions to further compress the data, but allowing some information which is not significant to be lost.

One such approach in accordance with the invention is to recognize that any real optical detector has noise which, in the case of a photon-counting detector, is in the form of "dark counts", i.e., "false positives". In addition to dark counts, stray light can produce unwanted signal photons. These sources of noise taken together constitute the "background". The background contains no useful information, and a compression technique in accordance with the invention distinguishes between useful signal and background to allow elimination of the background from storage, further compressing the data.

If it is known that in a given data integration time, T, each array element (x,y,t) will accumulate $n_{background}$ background counts on average, then any value n less than some value $n_{threshold}$ can be considered as 0, and dropped accordingly, while values of n greater than $n_{threshold}$ are reduced by $n_{threshold}$. Typically, $n_{threshold}$ will be approximately equal to $n_{background}$. This reduces considerably the storage required in any of the histogram modes above.

More sophisticated noise-reduction algorithms, such as spectral analysis techniques (e.g., Fourier filtering), could also be applied, which can, for example, determine if all the points in some region of x,y,t space contain only background counts. This determination is possible because the dark count is generated by a random process. Hence, the time-series representation of the dark count constitutes white noise which is easily recognized by autocorrelation. A lag value may be determined by knowing the approximate shortest period of a desired histogram element. That is, if it is known that a switching event should not result in a duration of an optical emission pulse shorter than some minimum, then pulses of width less than this minimum can safely be assumed to be dark counts.

The previous paragraph describes Fourier filtering as applied in the time domain. The same approach can be applied to the spatial coordinates when the features of interest are known to occupy more than a single spatial pixel x,y.

Such more sophisticated threshold schemes are useful if the signal is weak so that a typical number of useful signal photons in an array element (x,y,t) was only a little larger than $n_{background}$. All such schemes can be categorized by the term data compression by elimination of background counts.

An algorithm for compressing data into this form is similar to the algorithm above for lossless compression, except that, after n is determined, only those values of $n > n_{threshold}$ are stored.

In accordance with another embodiment of the invention, a given field effect transistor channel (or other circuit element of interest) or group of related channels, which in general occupy more than a single image pixel x,y, can be assigned to a group of pixels. If the x,y,t data for all pixels in the group associated with the given circuit element is stored, much of the information will be redundant. Therefore, rather than storing all such x,y,t data, optical emission photons for the circuit element as a whole can be stored in the list form w,t, where w identifies the particular circuit element or group of elements or other structural feature of the device under test. The data can also be stored in histogram form for the particular circuit element as n(w,t), where n is the number of photons stored in the list with coordinates w,t. The histogram n(w,t) for a particular circuit element w is the "optical waveform" for the circuit element w.

The means for selecting the group of pixels to be associated with the circuit element of interest can include, for instance, first performing a computerized image analysis of the time-integrated image or various time-resolved images to locate the emission sources on the chip and determining the pixel elements that line up physically with those regions of the chip. A second technique includes first consulting the design data describing the integrated circuit under test (schematic and/or layout data), and aligning elements of the layout with the field of view of the imaging apparatus. Still another technique is to first obtain an image of the chip using external illumination and aligning features on the chip with the field of view of the imaging apparatus.

In accordance with this embodiment, the optical data is stored as a series of optical waveforms, one waveform for each device of interest in the field of view of the optical detector. Thus data compression can be achieved because the number of optical waveforms to be stored for a particular field of view can be much less than the number of x,y pixels within the field of view. Compression also results because many x,y pixels correspond to no device of interest, and so data from such x,y pixels need not be stored.

This approach of storing the optical waveform for each device (rather than for each pixel associated with a device) within the optical field of view can also be applied while the data is being acquired, so as to minimize storage requirements of an initial data file. That is, the selection of the appropriate pixels to be associated with a particular device can be performed "on the fly" either manually by the user, or automatically by the system. Significantly, using this technique during data acquisition will provide a real-time readout of the optical waveforms to the user. If the pixels belonging to each device can be determined prior to acquisition of the emission data (from, for example, design data or an image taken with external illumination), then application of this technique is direct. If the pixels belonging to each device cannot be determined prior to acquisition of the emission data, then the determination can be done part way through the data acquisition. The data accumulated during this determination phase is then compressed to a series of optical waveforms, with the subsequent data added to these existing waveforms to improve their signal-to-noise ratios.

One of the methods of data presentation discussed in commonly owned and copending U.S. patent application Ser. No. 08/683,837, filed Jul. 18, 1996, and incorporated herein by reference, is to display the optical data in the form of a "movie", i.e., a sequential series of time-resolved images. Such a movie can also be generated after compressing the data by storage of optical waveforms. Specifically, from the time-integrated image or various time-resolved images, the spatial intensity pattern of each device can be determined. The optical waveform of that device can then be used to appropriately scale this spatial intensity pattern for each frame of the movie.

Finally, it may be possible to store the optical waveform data in a more compact form than intensity vs. time. Since the waveform data is usually a series of pulses separated by longer stretches where there is no optical emission, one could store just those time values with nonzero emission for that device. In addition, shot noise from the photon counting statistics could be filtered out by any standard filtering technique. If certain devices have a standard temporal shape to each pulse, then further compression can be obtained by storing the time position and amplitude for each observed pulse. Fourier, Laplace, or wavelet transform techniques can be used to filter and store the meaningful information contained in each optical waveform. Filtered data can be stored in either the time domain or the frequency domain.

We claim:

1. A method for compressing data representing an optical image of an operating circuit, comprising:

iteratively applying a test input to the circuit;

for each of a multitude of positions x,y in the circuit, for each iteration i, and for each of a plurality of time increments t during each iteration, detecting individual photons emitted from the position in response to the test input;

for each of the positions x,y and for each time increment t, determining the number n of photons detected for the position over all i;

storing in a database only each x,y,t,n for which n is greater than a threshold.

2. The method of claim 1, wherein the threshold is zero.

3. The method of claim 1, wherein the threshold is equal to a value representing the background noise in the environment in which the circuit is being tested.

4. The method of claim 1, wherein the threshold represent dark counts.

5. The method of claim 1, wherein the step of determining whether or not a photon was detected is performed using an optical imaging system.

6. The method of claim 1, wherein each x,y,t,n for which n is greater than a threshold is stored only if the range of t for a given x,y is greater than a second threshold, the second threshold representing a length of time known to correspond to shortest possible optical pulse.

7. The method of claim 1, wherein each location w corresponds to plurality of pixels x,y which are determined to be a single element or group of elements of the circuit under test.

8. The method of claim 7, wherein the element of the circuit under test is a field effect transistor channel or group of field effect transistor channels.

9. A method for compressing data representing an optical image of an operating circuit, said data taking the form of pixel data generated by an optical imaging system, comprising:

associating a plurality of pixels with one element w of the circuit to be imaged, wherein any given pixel is associated with at most one circuit element;

applying a test signal to the circuit under test;

generating an optical waveform of light emissions from said one element of the circuit under test at t intervals during the circuit's processing of the test signal, said optical waveform being generated in response to each associated pixel's detection of light emitted from said one element;

storing in a database a plurality of optical waveforms in the form of n(w,t).

10. The method of claim 9, wherein the optical waveform for the element represents the data corresponding to one pixel of the group of pixels.

11. The method of claim 9, wherein the optical waveform is a representative sample of data corresponding to each pixel in the group.

12. The method of claim 9, wherein a plurality of elements of the circuit under test are observed during the test, each element having its own associated set of pixels.

13. The method of claim 9, wherein the step of associating a plurality of pixels with an element w of the circuit comprises:

applying an input signal to the circuit under test;

observing regions on the chip that generate light in response to the input, selecting as associated pixels for a given element w all pixels corresponding in location to a region of the circuit that generated light during the test.

14. The method of claim 13, wherein the input signal applied to the circuit under test is the test signal, and wherein the selection of associated pixels is performed as the circuit is being tested.

15. The method of claim 9, wherein the step of associating a plurality of pixels with an element w of the circuit comprises:

obtaining a view of the circuit under test using an optical imaging apparatus;

registering the image with a description of the layout of the circuit under test to determine the location within the view of a particular element w in the circuit;

associating with the element w all pixels having a location corresponding to the location of the element.

16. A system for compressing data representing an optical image of an operating circuit, comprising:

means for iteratively applying a test signal to the circuit;

means for detecting, for each of a multitude of positions x,y in the circuit, for each iteration i, and for each of a plurality of time increments t during each iteration, individual photons emitted from the position in response to the test signal;

means for determining for each of the positions x,y and for each time increment t, the number n of photon detected for the position over all i;

means for storing in a database only each x,y,t,n for which n is greater than a threshold.

17. A system for compressing data representing an optical image of an operating circuit, said data taking the form of pixel data generated by an optical imaging system, comprising:

means for associating a plurality of pixels with one element w of the circuit to be imaged, wherein any given pixel is associated with at most one circuit element;

means for applying a test signal to the circuit under test;

means for generating an optical waveform of light emissions from said one element of the circuit under test at t intervals during the circuit's processing of the test signal, said optical waveform being generated in response to each associated pixel's detection of light emitted from said one element;

means for storing in a database a plurality of optical waveforms in the form of w,t.

18. A method according to claim 1, wherein said threshold varies depending on the position x,y and the time increment t.

* * * * *